US009751754B2

(12) United States Patent
Kurashima et al.

(10) Patent No.: US 9,751,754 B2
(45) Date of Patent: Sep. 5, 2017

(54) PACKAGE FORMATION METHOD AND MEMS PACKAGE

(71) Applicant: NATIONAL INSTITUTE OF ADVANCED INDUSTRIAL SCIENCE AND TECHNOLOGY, Tokyo (JP)

(72) Inventors: Yuuichi Kurashima, Ibaraki (JP); Hideki Takagi, Ibaraki (JP); Atsuhiko Maeda, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/112,222

(22) PCT Filed: Jan. 27, 2015

(86) PCT No.: PCT/JP2015/052181
§ 371 (c)(1),
(2) Date: Jul. 18, 2016

(87) PCT Pub. No.: WO2015/111753
PCT Pub. Date: Jul. 30, 2015

(65) Prior Publication Data
US 2016/0332870 A1 Nov. 17, 2016

(30) Foreign Application Priority Data
Jan. 27, 2014 (JP) .................................. 2014-012308

(51) Int. Cl.
B81C 1/00 (2006.01)

(52) U.S. Cl.
CPC .... *B81C 1/00269* (2013.01); *B81C 2203/019* (2013.01); *B81C 2203/0118* (2013.01); *B81C 2203/035* (2013.01)

(58) Field of Classification Search
None
See application file for complete search history.

(56) References Cited

FOREIGN PATENT DOCUMENTS

| JP | 9-10963 | 1/1997 |
| JP | 9-64544 | 3/1997 |

(Continued)

OTHER PUBLICATIONS

Ishizuka et al., "Low-temperature wafer bonding for MEMS packaging utilizing screen-printed sub-micron size Au particle patters", Microelectronic Engineering, Aug. 2011, pp. 2275-2277, vol. 88; Issue 8.

(Continued)

*Primary Examiner* — Asok K Sarkar
(74) *Attorney, Agent, or Firm* — Greenblum & Bernstein, P.L.C.

(57) ABSTRACT

This invention includes a sacrificial thin film formation step for chemical-mechanical polishing a temporary substrate made of a readily polishable material and sputtering a metal thin film along the smoothly polished surface, and a first bonding step for forming a sealing frame obtained by bringing at least a noble metal on the metal thin film and bonding a substrate on the sealing frame. This invention also includes a temporary substrate removal step for then removing the metal thin film along with the temporary substrate and exposing a new surface at the tip of the sealing frame; and a second bonding step for sputtering a noble metal thin film around a precision machine element on the machine substrate, bringing the new surface of the sealing frame into contact onto the noble metal thin film and bonding the new (Continued)

(a)

(b)

surface of the sealing frame onto the noble metal thin film at room temperature.

12 Claims, 4 Drawing Sheets

(56) References Cited

FOREIGN PATENT DOCUMENTS

| | | |
|---|---|---|
| JP | 2005-276910 | 10/2005 |
| JP | 2009-170445 | 7/2009 |
| JP | 2012-009862 | 1/2012 |
| WO | 2005/122217 | 12/2005 |

OTHER PUBLICATIONS

Yamamoto et al., "Low-temperature bonding of laser diode chips using N2 atmospheric-pressure plasma activation", Proceedings of JSPE Semestrial Meeting 2013 JSPE Spring Conference, , PP.

Ishida et al., "Low-temperature, surface-complaint wafer bonding using sub-micron gold particles for wafer-level MEMS packaging", Electronic Components and Technology Conference (ECTC), 2012 IEEE 62nd, May 29, 2012, pp. 1140-1145.

Kurashima et al., "Room temperature wafer bonding of metal films using flattening by thermal imprint process", Microelectronic Engineering, Jun. 10, 2013, pp. 52-56, 112.

International Search Report issued in PCT/JP2015/052181, dated Apr. 28, 2015.

(a)                    (b)

(a)

(b)

PACKAGE FORMATION METHOD AND MEMS PACKAGE

TECHNICAL FIELD OF THE INVENTION

Our invention relates to a package for hollow-sealing of elements and a formation method thereof, and particularly relates to a package suitable for accommodating a precision mechanism such as Micro Electro Mechanical System (MEMS) in a hollow-sealed interior space and a formation method thereof.

BACKGROUND ART OF THE INVENTION

A Micro Electro Mechanical System (MEMS) of mechanical elements combined with electronic circuit elements is provided with a hollow package to physically protect fine moving part from external environments. Such a package may be formed by a known method in which a sealing substrate provided with a sealing frame (sealing pattern) or a bump electrode having a height of some μm to dozens μm are formed by metal plating and bonded onto a MEMS substrate by thermocompression. The metal constituting the sealing frame or bump electrode is often made of gold (Au) which is excellent in workability as well as physical characteristics such as high electric conductivity, high deformability and high corrosion resistance.

Patent document 1 discloses package formation methods with their advantages and disadvantages, and discloses a method to bond them with a bonding material by thermocompression performed at a temperature lower than the melting temperature of the bonding material to soften without generating liquid phase. This method allegedly makes it possible to perform the thermocompression at a relatively low pressure while not requiring a process in which the bonded surface is highly smoothed (to lower roughness) or is deoxygenated by highly cleaned with extreme purity. The material for bonding the interface may be unalloyed metal such as Au, Sn, Cu and Al, a single phase of alloy such as AuSn, $Au_5Sn$ and AuIn, or mixture thereof.

Non-patent document 1 discloses a package formation method, in which a predetermined sealing frame is formed by photoresist development on titanium-sputtered thin film having thickness of 50 nm and gold-sputtered thin film having thickness of 200 nm formed on wafers made of silicon or glass and then a sealing material made of gold particles is provided on the sealing frame by using a screen mask to perform thermocompression between the wafers. The two wafers are heated to 300° C. in a vacuum chamber and then are bonded together at pushing pressure of 73 MPa for 30 min. The pushing pressure can be decreased by the sealing material made of gold particles, which is porous and easily deformed at the time of bonding.

Non-patent document 2 discloses a low-temperature bonding method, in which gold stud bumps are formed on a gold thin film of silicon substrate and are subject to a coining with silicon chip to make the gold bump have a smooth top face to be activated with nitrogen atmosphere plasma and then bonded onto a gold thin film electrode having a surface activated by the same method as the top face. The bumps are heated to 150° C. and bonded at pushing pressure of 320 MPa for about 30 sec. In the coining process, when the tip of bump is sharpened the smooth top face can be formed even at a low temperature and low pushing pressure.

PRIOR ART DOCUMENTS

Patent Documents

Patent Document 1: IP2012-009862-A

Non-Patent Documents

Non-Patent Document 1: S. Ishizuka, N. Akiyama, T. Ogashiwa, T. Nishimori, H. Ishida, S. Shoji, J. Mizuno; Low-temperature wafer bonding for MEMS packaging utilizing screen-printed sub-micron size Au particle patterns; Microelectronic Engineering Volume 88; Issue 8, August 2011, pp 2275-2277

Non-Patent Document 2: Michitaka YAMAMO TO, Eiji HICATRASK Tadatomo SUGA, Renshi SAWADA; "Low-temperature bonding of laser diode chips using $N_2$ atmospheric-pressure plasma activation"; Proceedings of JSPE Semestrial Meeting 2013 JSPE Spring Conference

SUMMARY OF THE INVENTION

Problems to be Solved by the Invention

As described above, the thermocompression would require heating and pressurization to enhance adhesiveness at the bonding interface, so that the bonding interface is deformed. However the heating might deform or destroy the substrate due to a generating of thermal stress in the junction between different kinds of materials on the substrate. That might cause even deterioration of device characteristics or alignment precision. Further, required time for such a process might become relatively long.

Accordingly, it could be helpful to provide a package for hollow-sealing of elements and a formation method thereof, and particularly a package suitable for accommodating a precision mechanism such as Micro Electro Mechanical Systems (MEMS) in a hollow-sealed interior space and a formation method thereof.

Means for Solving the Problems

Our invention is a package formation method for housing a precision machine element on a machine substrate in a hollow-sealed interior space, comprising: a sacrificial thin film formation step to perform a chemical-mechanical polishing with a temporary substrate made of an easily polishable material and sputter a metal thin film on the smoothly polished surface; a first bonding step to form a sealing frame by bringing at least a noble metal on the metal thin film and bond a substrate with the sealing frame; a temporary substrate removal step to remove the metal thin film together with the temporary substrate and expose a newborn face at a tip of the sealing frame; and a second bonding step to form a noble metal thin film around the precision machine element on the machine substrate, bring the newborn face of the sealing frame into contact onto the noble metal thin film, and join the newborn face of the sealing frame onto the noble metal thin film at room temperature.

According to such a configuration, a newborn smooth noble metal face can easily be formed by transferring the smooth face of temporary substrate on an end face of sealing frame and can be bonded with a noble metal smooth face of machine substrate at room temperature. With such a configuration, a package can be made suitable for housing a precision mechanism (machine element) such as a Micro Electro Mechanical Systems in a hollow-sealed interior space, without requiring any excessive heating and pressurization.

In the configuration, it is possible that the first bonding step includes a step to form the sealing frame by a plating method, and the sacrificial thin film formation step includes a step to form a seed metal thin film made of a noble metal on the metal thin film made of titanium or chrome. With such a configuration, the sealing frame can efficiently be formed by metal plating without affecting the newborn tip face of the sealing frame.

In the configuration, it is possible that the noble metal constituting the seed metal thin film is gold. It is also possible that the second bonding step includes a step to activate bonding surfaces by plasma ashing. With such a configuration, a package can be made more suitable for housing a precision mechanism (machine element) such as a Micro Electro Mechanical Systems in a hollow-sealed interior space while the bonding can be ensured at room temperature.

In the configuration, it is possible that the bonding at the room temperature is performed at 200° C. or less. With such a configuration, a package can be made further suitable for housing a precision mechanism such as a Micro Electro Mechanical System in a hollow-sealed interior space while the machine substrate can be prevented from deforming thermally.

A MEMS package formed by the package formation method described above is characterized by being capable of maintaining an interior vacuum condition of $10^{-4}$ Pa at least for 6 months. With such a package, operations of MEMS inside the hollow-sealed interior space can be maintained for a long term.

EMBODIMENTS FOR CARRYING OUT THE INVENTION

Figure 1:
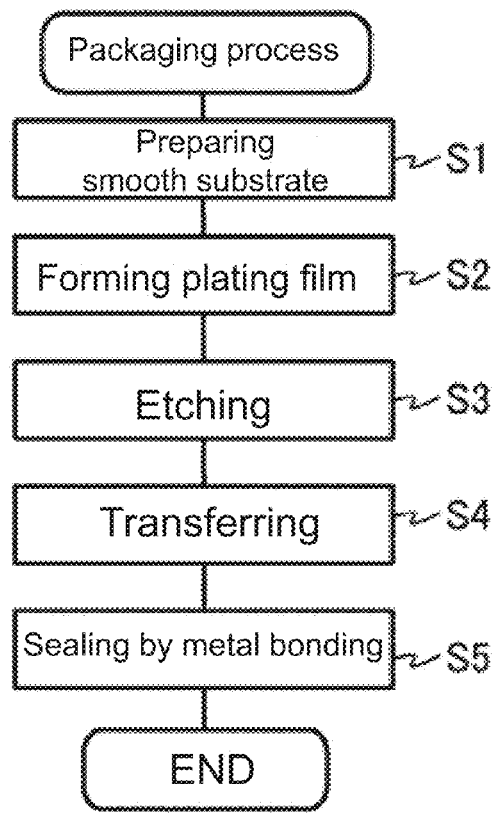
FIG. 1 is a process chart of package formation method according to our invention.

Hereinafter, our package formation method will be explained with reference to FIG. 1 showing a flow of packaging process and FIGS. 2 to 4 as needed.

[Step for Preparing Smooth Substrate: S1]

As shown in FIG. 2(a), super smooth face 1a in terms of nanometer order is formed on substrate 1 made of material polishable easily. In details, super smooth face 1a is formed on substrate 1 polished by CMP (Chemical Mechanical Polishing) or the like to be smoothed at the atomic level with high precision. It is preferable that easily polishable material such as Si, sapphire, quartz and glass is used as substrate 1, because substrate 1 doesn't remain in the final package structure (cf. FIG. 4(b)) as described later and therefore material of the package is not limited thereto.

[Step for Forming Plating Film: S2]

As shown in FIG. 2(b), sacrificial thin film 11 having thickness around some ten nm is formed by sputtering, such as vapor deposition and ion beam sputtering, on super smooth face 1a of substrate 1. Sacrificial thin film 11 having a smooth top face transferred from super smooth face 1a of substrate 1 should be thinner to the extent maintaining functions of transferring super smooth face 1a as a thin film without generating island or pinhole. On the other hand, sacrificial thin film 11 should have desirable material and thickness so that seed thin film 12 and plating film 14 hardly react on the sacrificial thin film and are easily peeled from the sacrificial thin film. It is preferable that it is made of Ti which is selectively etched with hydrofluoric acid solution together with seed thin film 12 and plating film made of Au in transferring step S4 to be described later. It is possible that sacrificial thin film 11 is made of Cr which is etched with properly-selected etchant.

Seed thin film 12 providing an electrodeposition face of plating film 14 is formed by sputtering on sacrificial thin film 11. Seed thin film 12 may be made of a conductive noble metal such as Au.

As shown in FIG. 2(c), resist 13 is formed in the reversed pattern of a desirable sealing frame on sacrificial thin film 11. Then as shown in FIG. 2(d), plating film 14 made of noble metal is formed through a window of resist 13 on seed thin film 12. Plating film 14 is typically an Au plating film made by electrolytic plating. Seed thin film 12 may be omitted when plating film 14 is formed directly on conductive sacrificial thin film 11.

[Etching Step: S3]

As shown in FIG. 2(e), resist 13 is dissolved with acetone while seed thin film 12 except a portion below plating film 14 is removed with predetermined solution or gas. Thus a sealing frame pattern comprising plating film 14 and seed thin film 12 between sacrificial thin film 11 and plating film 14 is formed on substrate 1.

[Transferring step: S4]

As shown in FIG. 3(a), sealing substrate 21 made of Si having a face of metal thin film 14' made of Au is placed on the side of plating film 14 on substrate 1, Then as shown in FIG. 3(b), they are compressed with each other as being heated. It is possible that metal thin film 14' is formed all over the face sealing substrate 21 or is formed as corresponding to the sealing frame pattern.

As shown in FIG. 3(c), only sacrificial film 11 is selectively etched chemically without etching seed thin film 12 and plating film 14 to form sealing cover 14a integrating seed thin film 12 and plating film 14 on substrate 1 and metal thin film 14' on sealing substrate 21. Then, a smooth top face of sacrificial film 11, namely a newborn smooth face made by transferring super smooth face 1a of substrate 1, appears on tip face 14a1 of wall portion of sealing cover 14a.

[Step for sealing metal bonding: S5]

As shown in FIG. 4(a), a surface as smooth as super smooth face 1a of substrate 1 is formed on MEMS substrate 31 provided with MEMS device 31a, and then metal thin film 31b made of Au or the like is formed on it. It is possible that metal thin film 31b is formed all over MEMS substrate 31 or is formed as corresponding to the sealing frame pattern. An adhesion layer not shown or the like may be provided between MEMS substrate 31 and metal thin film 31b.

Tip face 14a1 of sealing cover 14a and metal thin film 31b are activated on the surface where organics or the like on the surface have been removed by plasma ashing with oxygen or argon.

As shown in FIG. 4(b), sealing substrate 21 and MEMS board 31 faced to each other are held at a temperature of 200° C. or less, so that activated surfaces of tip face 14a1 of sealing cover 14a and metal thin film 31b are put together with metal bonding to prepare a strong package structure having sealing wall 14b integrated.

The above-described packaging process can be performed at lower temperature and lower pressure than conventional methods, and can save cost and prevent the operation reliability of MEMS devices including precision mechanism from being violated.

Figure 4:
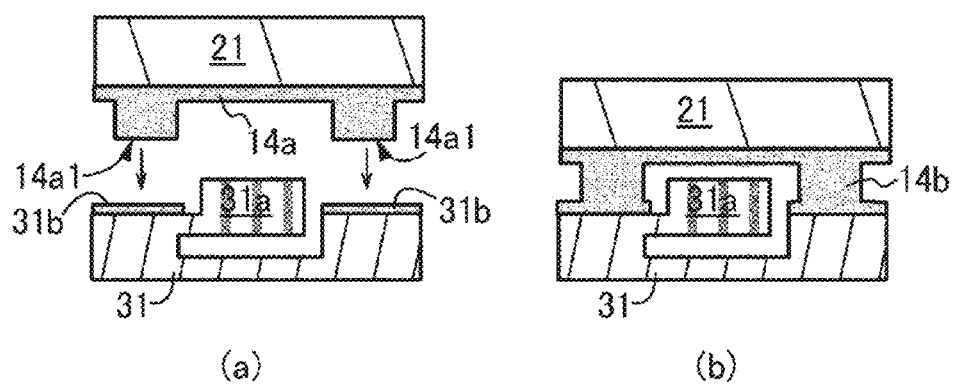
FIG. 4 is a cross sectional view of sealing step of the metal bonding in the package formation method.
Figure 5:
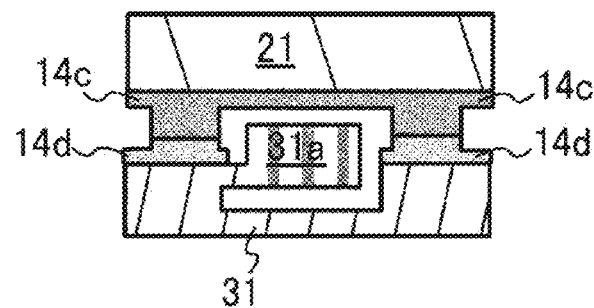
FIG. 5 is a cross sectional view of packaged structure after the sealing step of the metal bonding by the package formation methods.

As shown in FIG. 5, it is possible that sealing wall 14b (cf. FIG. 4) has metal junction 14d made of Au between activated surfaces as well as another part 14c made of another material. Namely in the step shown in FIG. 2(d), plating film 14 made of another material other than Au is formed directly on seed thin film made of Au, or another material is applied onto seed thin film 12 through a window of resist 13. With such a configuration, the amount of use of expensive Au can be suppressed to reduce a material cost.

[Smoothness Evaluation]

Figure 6:
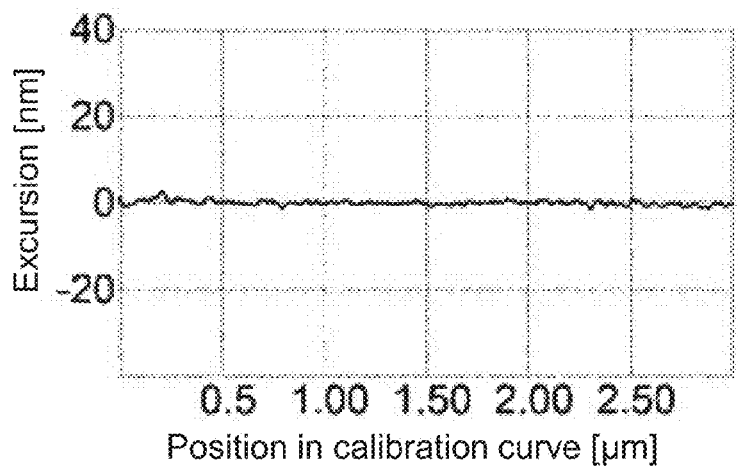
FIG. 6 is a graph showing measured surface roughness.
Figure 6:
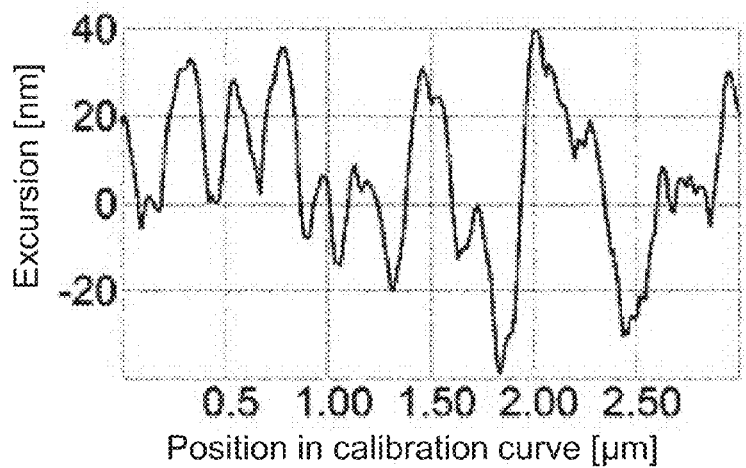

FIG. 6 shows results of measurement of surface roughness on tip face 14a1 of wall portion of sealing cover 14a with an atomic force microscope.

Figure 2:
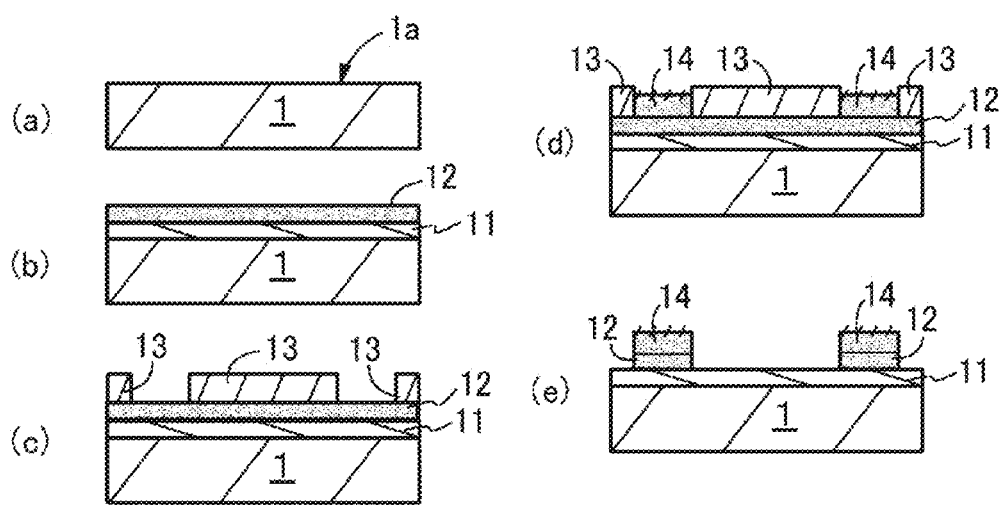
FIG. 2 is a cross sectional view of the package formation method up to the film plating step.
Figure 3:
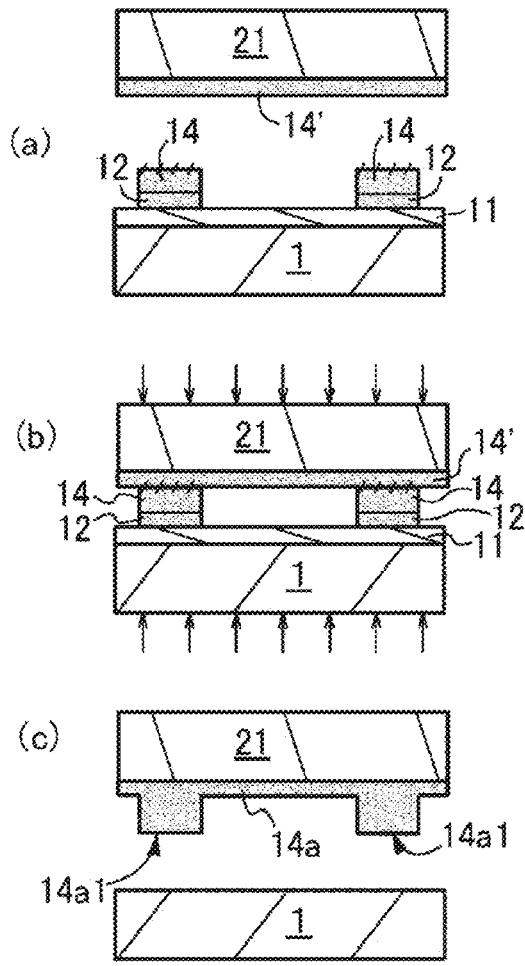
FIG. 3 is a cross sectional view of transfer step in the package formation method.

As shown in FIGS. 2 to 4, substrate 1 made of Si is polished with abrasive grains made of colloidal silica to make super smooth face 1a, to which sacrificial thin film 11 made of Ti is applied by 30 nm thickness, seed thin film 12 made of Au is further applied by 50 nm thickness and plating film 14 made of Au is further applied by 10 μm thickness. Leaving seed thin film 12, only sacrificial thin film 11 is selectively etched chemically with 10% HF. Thus obtained part corresponding to tip face 14a1 of wall portion of sealing cover 14a is observed with an atomic force microscope to measure a surface roughness.

FIG. 6(a) shows results of measuring a range of inn square. It shows Sq of 0.84 nm, representing excellent smoothness. Super smooth face 1a has Sq of 0.2 nm while sacrificial layer thin film 11 has Sq of 0.6 nm.

On the other hand. FIG. 6(b) shows results of measuring the surface of plating film 14 on seed thin film 12, formed on ordinary substrate 1 made of Si. It shows surface roughness Sq of 16.2 nm, representing poor smoothness greatly worse than the Example.

[Bonding Performance Evaluation]

Next, the bonding performance of sealing substrate 21 and MEMS substrate 31 is evaluated through tensile test.

In details, a sample of 3 mm square frame (width 0.1 mm) is prepared similarly to the one used for the smoothness evaluation and is bonded with a substrate imitating substrate 31 to prepare a test piece for tensile test. It is set to an Instron type tension tester (made by Shimadzu Corporation; AGS-10kN) to measure a bonding strength at tensile speed of 0.5 [mm/min].

The average breaking strength is 318 N, representing almost the same level of bonding strength as the case of thermocompression between sealing substrate 21 and MEMS substrate 31. On the other hand, Comparative Example with a tensile test piece of Au-plated ordinary Si substrate shows 33 N of average strength as only 1/10 times as the strength above.

[Sealing Performance Evaluation]

An airtight sealing performance of a whole package is evaluated with SOI (Silicon On Insulator) substrate as a sealing substrate.

Figure 7:
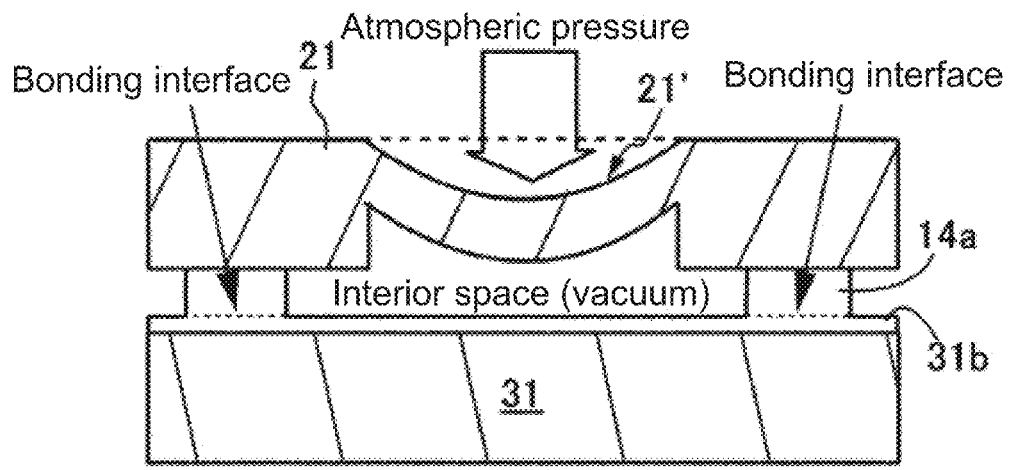
FIG. 7 is a diagram showing an experimental method for evaluating sealing performance

As shown in FIG. 7, the airtight sealing performance of a whole package can be evaluated by measuring a temporal change of elastic deformation generated in membrane portion 21' when interior space is vacuumed in SOI substrate 21 having thin membrane portion 21' having thickness around 10 μm which is supported by a peripheral support. Support of SOI substrate 21 and MEMS substrate (Si substrate) 31 are respectively provided with sealing frame 14a and metal thin film 31b. Their surfaces are activated with argon plasma like the above described Example and bonded together in a vacuum, and then are kept in the atmosphere. When the package is highly airtight as a whole the vacuum of the interior space is maintained and dent deformation generated in membrane portion 21' doesn't change with time. However, when the package has a low airtightness, the difference between exterior atmosphere and interior space pressure decreases with time because the air flows in the interior space and therefore the dent deformation generated in membrane portion 21' decreases.

In details, SOI substrate 21 is a board-shaped body having sides of 6 mm square and thickness of 500 μm, and is provided with sealing frame 14a made of Au having width of 100 μm and height of 10 μm formed by a temporary-substrate shape transferring method with sacrificial thin film 11 as described above. On the other hand, thin film 31b made of Au having thickness of 50 nm is formed with ion beam sputtering on the smooth face of MEMS substrate (Si substrate) 31. The surfaces are activated with argon plasma and bonded together in a vacuum ($10^{-4}$ Pa). As well as the bonding test piece for Example, total 3 kinds of test pieces are prepared as including a comparative test piece for Comparative Example 1 in which sealing frame 14a having a rough surface of raw plating is bonded together at room temperature in vacuum ($10^{-4}$ Pa) and another comparative test piece for Comparative Example 2 in which the same sealing frame 14a is smoothed by pushing at a high pushing pressure (5 MPa applied to a whole substrate at 200° C.) onto a smooth substrate and then bonded together.

Figure 8:
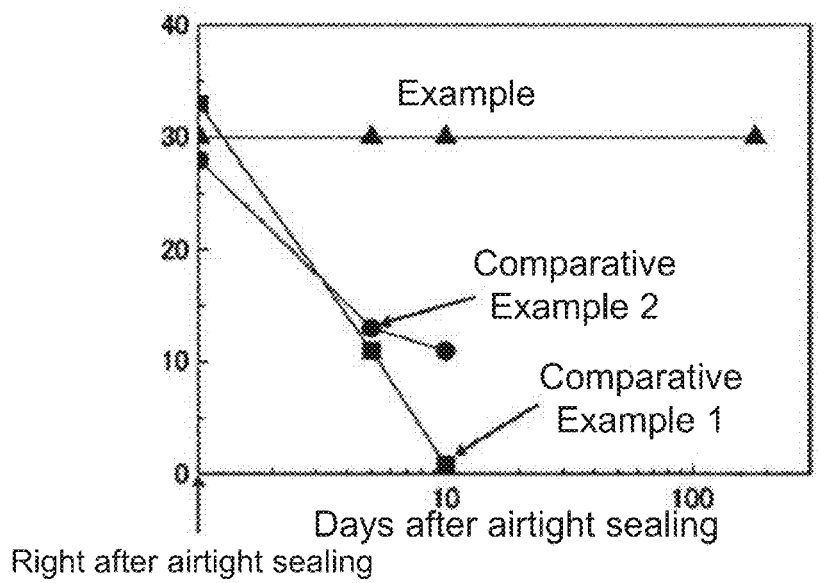
FIG. 8 is a graph showing results of evaluating sealing performance.

In Comparative Example 1 shown in FIG. 8, membrane portion 21' was deformed with dent having maximum depth of 35 μm right after the vacuum sealing. Then the dent was gradually relieved and finally dissolved 10 days later. In Comparative Example 2, although the deformation is generated by 30 μm right after the vacuum sealing, the dent is relieved to 13 μm five days later. In Example in contrast, the dent isn't relieved even 6 months later since the vacuum sealing and the airtightness of vacuum around $10^{-4}$ Pa has been maintained at least in the term. That represents that the airtightness can be maintained stably for a long term even when a gas such as dry air and inert gas is sealed inside the package.

Our invention is not limited to Example and its modified examples described above but covers various examples and modified examples as found by a skilled person within the purposes and claims of our invention.

EXPLANATION OF SYMBOLS

1: substrate
11: sacrificial thin film
12: seed thin film
13: resist
14: plating film
21: sealing substrate 31: MEMS substrate
31*a*: MEMS device
31*b*: metal thin film

The invention claimed is:

1. A package formation method for housing a precision machine element on a machine substrate in a sealed, hollow interior space, the method comprising:
    forming a sacrificial thin film by chemically and mechanically polishing a temporary substrate of a polishable material and sputtering a metal thin film on the polished surface;
    forming a sealing frame by applying at least a noble metal on the metal thin film, and bonding a substrate with the sealing frame;
    selectively removing the metal thin film of the temporary substrate and exposing a new face at a tip of the sealing frame; and
    forming a noble metal thin film around the precision machine element on the machine substrate, bringing the new face of the sealing frame into contact with the noble metal thin film, and bonding the new face of the sealing frame onto the noble metal thin film at room temperature.

2. The package formation method according to claim 1, wherein the forming a sealing frame includes forming the sealing frame by a plating method, and the forming a sacrificial thin film includes forming a seed metal thin film of a noble metal on the metal thin film of titanium or chrome.

3. A MEMS package formed by the package formation method according to claim 2, capable of maintaining an interior vacuum condition of $10^{-4}$ Pa for at least 6 months.

4. The package formation method according to claim 2, wherein the noble metal constituting the seed metal thin film is gold.

5. A MEMS package formed by the package formation method according to claim 4, capable of maintaining an interior vacuum condition of $10^{-4}$ Pa for at least 6 months.

6. The package formation method according to claim 4, wherein the forming a noble metal thin film includes activating bonding surfaces by plasma ashing.

7. A MEMS package formed by the package formation method according to claim 6, capable of maintaining an interior vacuum condition of $10^{-4}$ Pa for at least 6 months.

8. The package formation method according to claim 6, wherein the bonding at the room temperature is performed at 200° C. or less.

9. A MEMS package formed by the package formation method according to claim 8, capable of maintaining an interior vacuum condition of $10^{-4}$ Pa for at least 6 months.

10. A MEMS package formed by the package formation method according to claim 1, capable of maintaining an interior vacuum condition of $10^{-4}$ Pa for at least 6 months.

11. The package formation method according to claim 1, wherein the polished surface is a super smooth face having a surface roughness Sq of 0.2 nm or less.

12. The package formation method according to claim 1, wherein the sacrificial thin-film comprises titanium.

* * * * *